United States Patent [19]
Jeong

[11] Patent Number: 6,124,184
[45] Date of Patent: Sep. 26, 2000

[54] METHOD FOR FORMING ISOLATION REGION OF SEMICONDUCTOR DEVICE

[75] Inventor: Sang Moo Jeong, Seoul, Rep. of Korea

[73] Assignee: Hyundai Electronics Industries, Co., Ichon-shi, Rep. of Korea

[21] Appl. No.: 09/442,735

[22] Filed: Nov. 18, 1999

[30] Foreign Application Priority Data

Dec. 18, 1998 [KR] Rep. of Korea ..................... 98-56111

[51] Int. Cl.$^7$ .................................. H01L 21/76
[52] U.S. Cl. ........................... 438/435; 438/225; 438/425
[58] Field of Search .................... 438/221, 225, 438/296, 297, 424, 425, 435, 355, 359, 362

[56] References Cited

U.S. PATENT DOCUMENTS

| 5,173,436 | 12/1992 | Gill et al. | 438/296 |
| 5,747,376 | 5/1998 | Lee | 438/443 |
| 5,861,339 | 1/1999 | Lien | 438/452 |
| 5,910,018 | 6/1999 | Jang | 438/435 |

OTHER PUBLICATIONS

K. Ishimaru et al., Trench Isolation Technology with 1$\mu$ m Depth n–and p–wells for A Full–CMOS SRAM Cell with a 0.4 $\mu$m n$^+$/p$^+$ Spacing, 1994 Symposium on VLSI Technology Digest of Technical Papers, pps. 97–98.

*Primary Examiner*—Chandra Chaudhari
*Assistant Examiner*—David S Blum
*Attorney, Agent, or Firm*—Morgan, Lewis & Bockius LLP

[57] ABSTRACT

A method for forming an isolation region of a semiconductor device includes the steps of forming first and second insulating layers on a substrate, removing the second insulating layer over an isolation region, forming an oxide layer by oxidizing the first insulating layer over the isolation region, forming sidewall spacers at sides of the second insulating layer and over the isolation region, forming a trench by etching the oxide layer and the substrate at the isolation region, removing the sidewall spacers, forming a third insulating layer on the substrate in the trench, and forming an isolation layer in the trench.

36 Claims, 5 Drawing Sheets

METHOD FOR FORMING ISOLATION REGION OF SEMICONDUCTOR DEVICE

This application claims the benefit of Korean patent application No. 56111/1998, filed Dec. 18, 1998, which is hereby incorporated by reference.

BACKGROUND OF THE INVENTION

1. Field of the Invention

The present invention relates to a method for forming an isolation region of a semiconductor device, and more particularly, to a method for forming an isolation region of a semiconductor device with round active region edge corners when forming an isolation layer using a profiled groove isolation (PGI) trench structure.

2. Discussion of the Related Art

A number of methods are known for decreasing a size of a field oxide region (isolation region) for isolating semiconductor devices, and correspondingly increasing a size of an active region of the semiconductor devices. A local oxidation of silicon (LOCOS) method is often used to form the isolation region of a semiconductor device. This method is commonly used because of its simplicity and excellent reproducibility.

However, the LOCOS method forms a "bird's beak" at the field oxide layer's edge, which results in a decrease in the size of the active region of the semiconductor device. The "bird's beak" is a phenomenon where the field oxide layer encroaches on the active region. Therefore, the LOCOS method is not expected to be used for dynamic random access memory (DRAM) devices of 64 MB or more.

An advanced LOCOS method is employed for 64 MB or 256 MB DRAM devices that tries to prevent formation of the bird's beak or to remove the bird's beak entirely, in order to reduce the size of the isolation regions and increase the size of the active region.

However, the advanced LOCOS method has some disadvantages. Forming DRAM devices of 1 GB or more (requiring a cell region of 0.2 $\mu m^2$ and less) involves an increase in an area of the isolation region. A field oxide layer is formed on a surface of a silicon substrate, which in turn causes doping concentration in the silicon substrate to decrease, generating a leakage current, and degrading isolation region characteristics. Therefore, a different isolation region forming method for use in DRAM devices of 1 GB or more is being adopted to improve a thickness adjustment of the isolation region, and increase its isolating efficiency. This method involves formation of a trench.

A conventional method for forming a trench in an isolation region of a semiconductor device will be described below with reference to the attached drawings.

FIGS. 1A to 1E are cross-sectional views illustrating a conventional method for forming an isolation region of a semiconductor device.

As shown in FIG. 1A, a buffer oxide layer 2 and a nitride layer 3 are sequentially formed on a substrate 1.

As shown in FIG. 1B, a photoresist layer PR is coated on the nitride layer 3 to define an isolation region, and is patterned and selectively removed after an exposure and development processes. Subsequently, with the patterned photoresist layer PR serving as a mask, the nitride layer 3 and the buffer oxide layer 2 are sequentially etched, and then the substrate 1 is etched to form a trench 4.

The photoresist layer PR is removed, as shown in FIG. 1C. The surface of substrate 1 in the trench 4 is thermally treated to form a thermal oxide layer 5. A high density plasma (HDP) oxide layer 6 is then formed on an entire surface of nitride layer 3, including the thermal oxide layer 5 in the trench 4.

The formation of the thermal oxide layer 5 can prevent damage to the substrate 1 after the etching process that forms the trench 4. It can also relieve stress on the substrate 1 that is generated by a leakage current, or by an electric field concentration due to an angular shape of an upper corner "A" of a semiconductor device formed on the substrate 1.

As illustrated in FIG. 1D, the HDP oxide layer 6 and the nitride layer 3 are polished by a chemical mechanical polishing (CMP) method to form an isolation layer 6a at an upper portion of the trench 4.

The CMP process will be discussed below in detail. The HDP oxide layer 6 is polished to remain at the upper portion of the trench 4 of an isolation region. That is, when a top portion of the nitride layer 3 is exposed, the CMP process is stopped, removing the nitride layer 3. At this time, the nitride layer 3 is polished until a thickness of the nitride layer 3 becomes half of its previous thickness. Then the polishing process is stopped, and the nitride layer 3 is removed from the substrate 1.

As seen from FIG. 1D, the sharply angular shape of upper corner "A" of the trench 4 is slightly rounded due to the thermal oxidation process.

The buffer oxide layer 2 is removed, as shown in FIG. 1E. The isolation layer 6a is also partially removed to be slightly higher than or level with the trench 4.

A gate oxide layer and a gate electrode (not shown) are then formed on the substrate 1 after the PGI formation process described above.

The conventional method for forming an isolation region of a semiconductor device has the following disadvantages.

First, formation of the thermal oxide layer cannot completely relieve the stress on the corner "A" of the trench 4, such as stress due to a leakage current or due to an electric field concentration, because of the angular shape of the upper corner "A" of the semiconductor device where the trench 4 is formed. Thus, formation of a reliable isolation region is only partially successful.

Second, the angular shape of upper corner "A" of the trench 4 may cause formation of voids in the trench 4, since the filling of the HDP oxide layer 6 is incomplete when an isolation layer is formed in the trench 4. This problem becomes more serious with more highly integrated semiconductor devices.

SUMMARY OF THE INVENTION

Accordingly, the present invention is directed to a method for forming an isolation region of a semiconductor device that substantially obviates one or more of the limitations and disadvantages of the related art.

An object of the present invention is to provide a method for forming an isolation region of a semiconductor device that can form rounded upper corners of a trench.

Another object of the present invention is to improve PGI isolation layer characteristics by using a LOCOS method.

Additional features and advantages of the invention will be set forth in the description which follows, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, in one aspect of the present invention there is provided a method for forming an isolation region of a semiconductor device, the method including the steps of forming first and second insulating layers on a substrate, removing the second insulating layer over an isolation region, forming an oxide layer by oxidizing the first insulating layer over the isolation region, forming sidewall spacers at sides of the second insulating layer and over the isolation region, forming a trench by etching the oxide layer and the substrate at the isolation region, removing the sidewall spacers, forming a third insulating layer on the substrate in the trench, and forming an isolation layer in the trench.

In another aspect of the present invention there is provided a method of forming an isolation region of a semiconductor device including the steps of forming a first insulating film on a substrate, forming a second insulating film on the first insulating film, selectively removing the second insulating film over an isolation region, oxidizing the first insulating film over the isolation region to form an oxide film, forming sidewall spacers at sides of the second insulating film, selectively removing the second insulating film and a portion of the substrate to form a trench in the substrate, removing the sidewall spacers, forming a third insulating film in the trench, and forming an isolation layer in the trench.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1A to 1E are cross-sectional views showing a conventional method for forming isolation regions of a semiconductor device; and FIGS. 2A to 2H are cross-sectional views illustrating a method for forming isolation regions of a semiconductor device according to the present invention.

DETAILED DESCRIPTION OF PREFERRED EMBODIMENT

Reference will now be made in detail to the preferred embodiments of the present invention, examples of which are illustrated in the accompanying drawings.

Figure 1A:
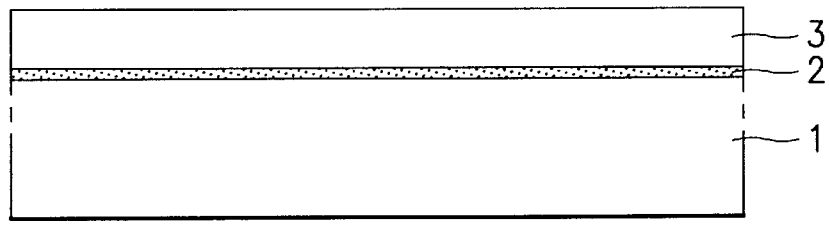
Figure 1B:
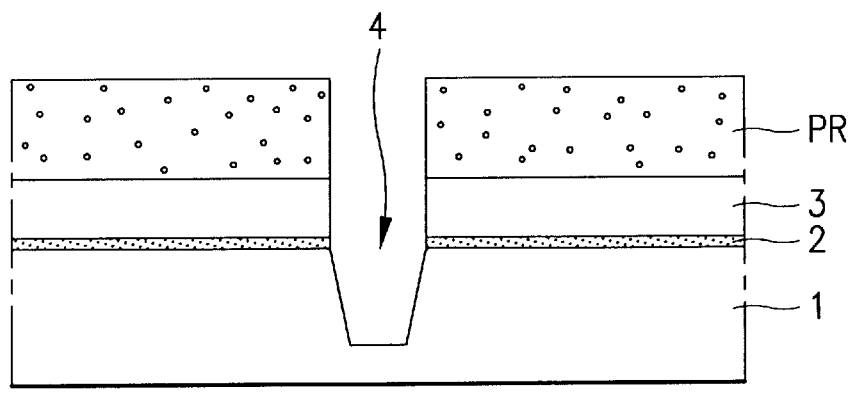
Figure 1C:
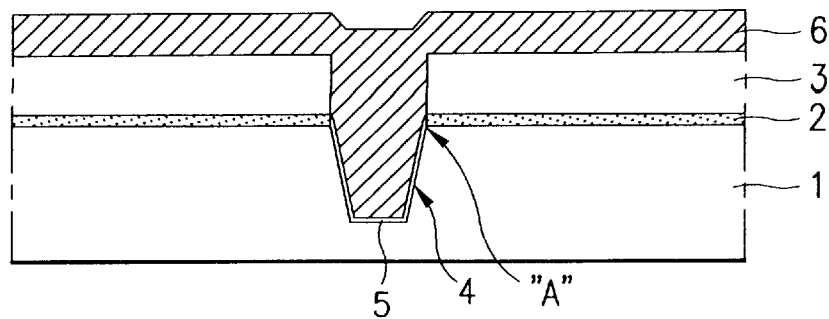
Figure 1D:
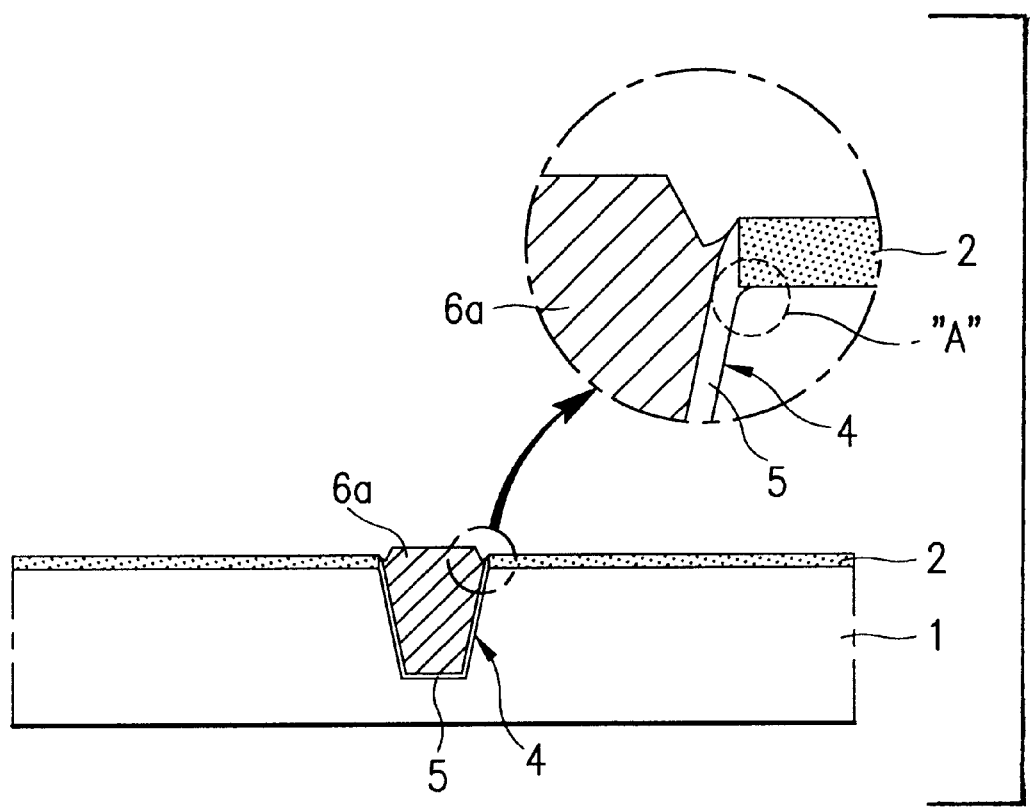
Figure 1E:
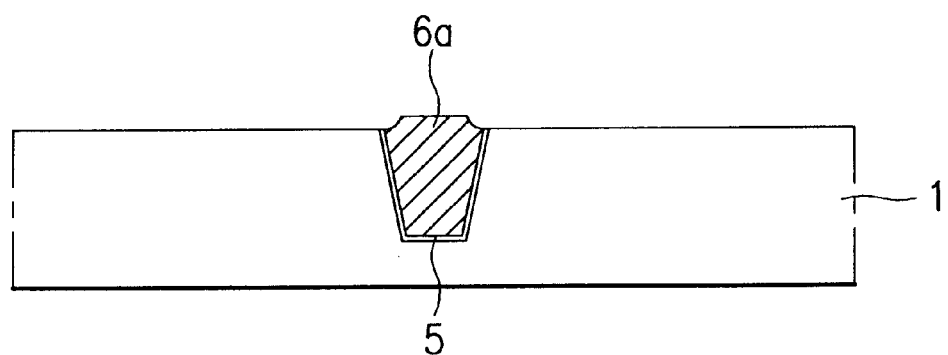
Figure 2A:
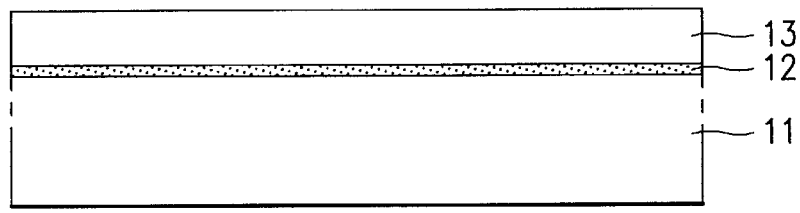

As shown in FIG. 2A, first and second insulating layers 12 and 13 are sequentially formed on a substrate 11. The first insulating layer 12 is an oxide layer, and the second insulating layer 13 is a nitride layer. The insulating layers 12 and 13 have different etching selectivity ratios. The second insulating layer 13 is more than ten times as thick as the first insulating layer 12, and has a thickness of at least 1500 Å.

Figure 2B:
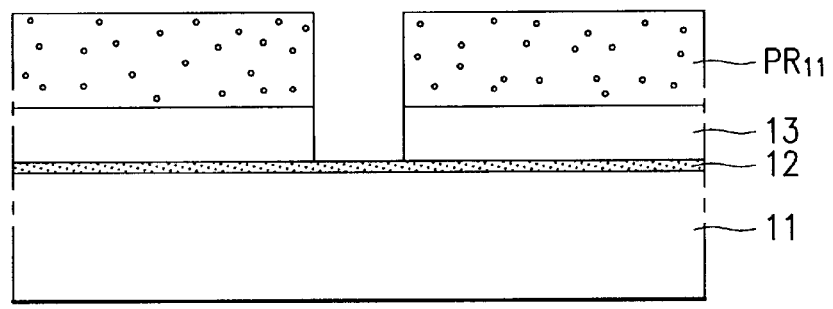

As shown in FIG. 2B, a photoresist layer $PR_{11}$ is coated on the second insulating layer 13, to define an isolation region, and is patterned and selectively removed after exposure and development. Subsequently, with the patterned photoresist layer $PR_{11}$ serving as a mask, the second insulating layer 13 is etched and selectively removed over the isolation region.

Figure 2C:
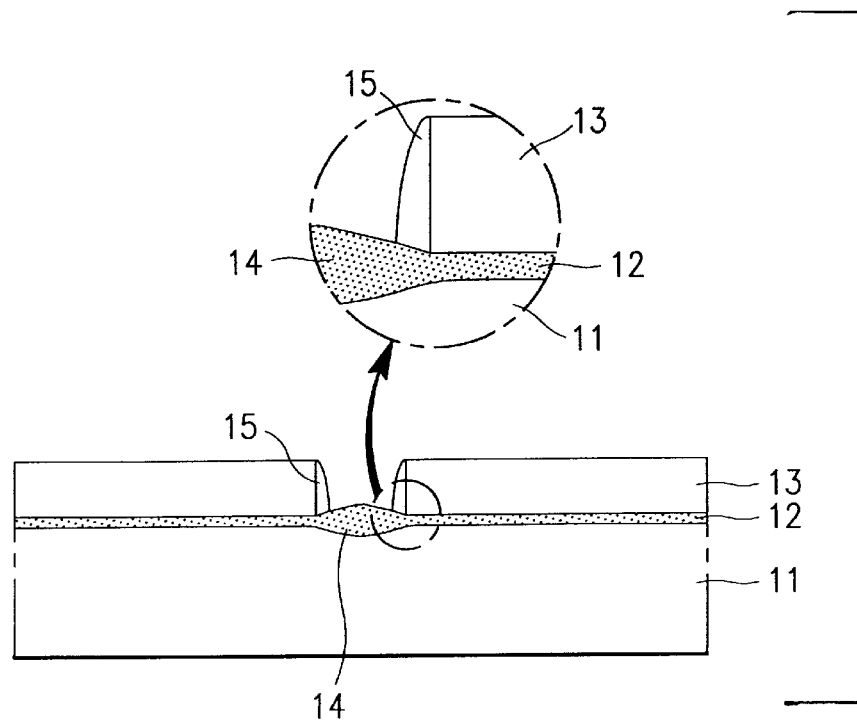

As shown in FIG. 2C, the photoresist layer $PR_{11}$ is removed. Thereafter, the first insulating layer 12 is oxidized to form an oxide layer 14 (a field oxide layer). Subsequently, sidewall spacers 15 are formed at sides of the second insulating layer 13 at both sides of the oxide layer 14.

The sidewall spacers 15 may also be formed from more than one oxide layer and/or nitride layer. An insulating layer for the sidewall spacers 15 is formed on an entire surface of second insulating layer 13, including the oxide layer 14, and then etched back by reactive ion etching (RIE), to form the sidewall spacers 15 at sides of the second insulating layer 13. If the sidewall spacers 15 are formed from an oxide, an HDP oxide layer is used.

The oxide layer 14 has a thickness of up to ⅓ of the thickness of the second insulating layer 13, and is two to three times as thick as the first insulating layer 12. The oxide layer 14 preferably has a thickness of 200 to 300 Å. The second insulating layer 13 is more than five times as thick as the oxide layer 14, such that its bottom edge corner adjacent to the sidewall spacers 15 never changes. In addition, the substrate 11 reacts with oxygen during the oxidation process, to form the oxide layer 14 (an $SiO_2$ layer), rounding an upper edge of the oxide layer 14 and its surface.

Figure 2D:
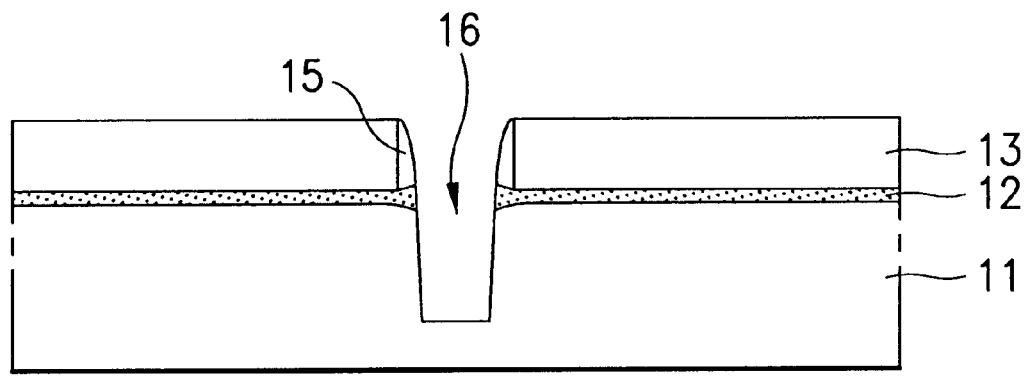

As shown in FIG. 2D, with the sidewall spacers 15 and the nitride layer 13 acting as masks, the oxide layer 14 and the substrate 11 are etched to form a trench 16 having a PGI structure.

The process shown in FIG. 2D would leave sidewall spacers 15 made from a nitride (which differ in their etching selectivity ratio from the oxide layer 14 and the substrate 11) undamaged.

Note that if the sidewall spacers 15 are formed from the oxide layer 14, they are also removed (not shown) when the oxide layer 14 and the substrate 11 are etched to form the trench 16.

Figure 2E:
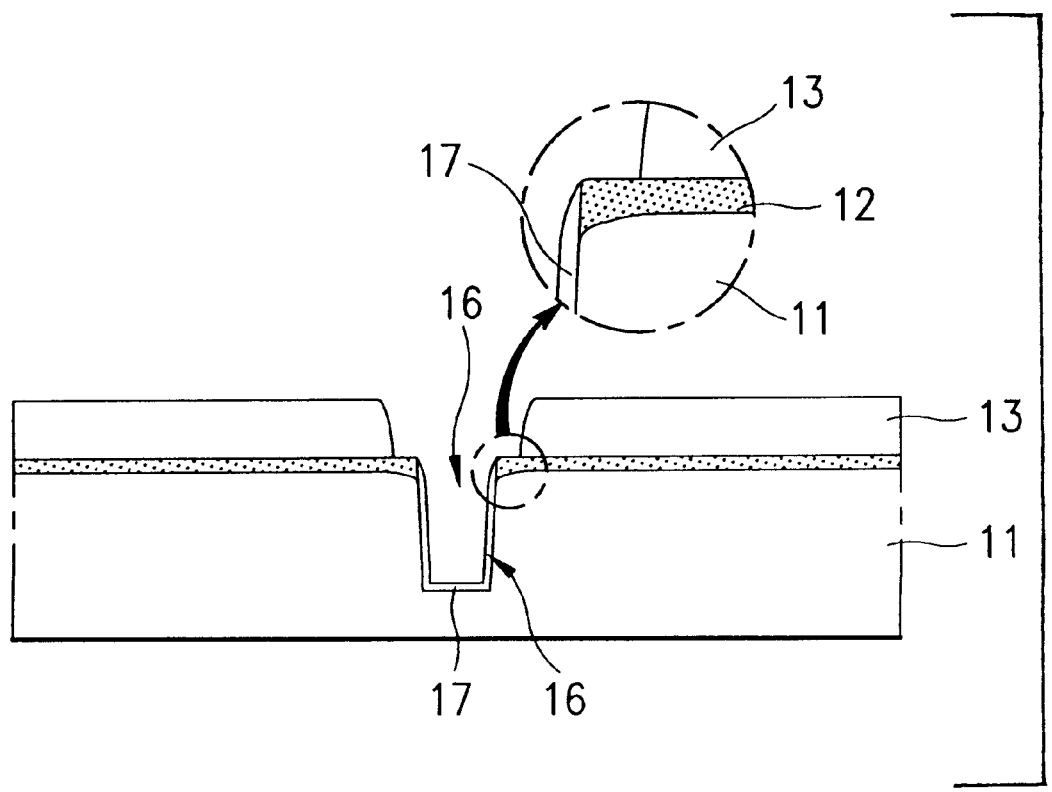

The sidewall spacers 15 are removed, as illustrated in FIG. 2E. Next, a third insulating layer 17 is formed on the substrate 11 in the trench 16. The third insulating layer 17 is a thermal oxide layer formed by thermally treating the exposed substrate 11. The thermal oxidation process alleviates etching damage caused during trench formation, and forms a rounded upper corner at sides of the trench 16. The sidewall spacers 15 are then removed, and the second insulating layer 13 that has the same etching selectivity ratio as the sidewall spacers 15 is also reduced in thickness. That is, a portion of the second insulating layer 13 is etched to a predetermined thickness where the sidewall spacers 15 are not formed.

Figure 2F:
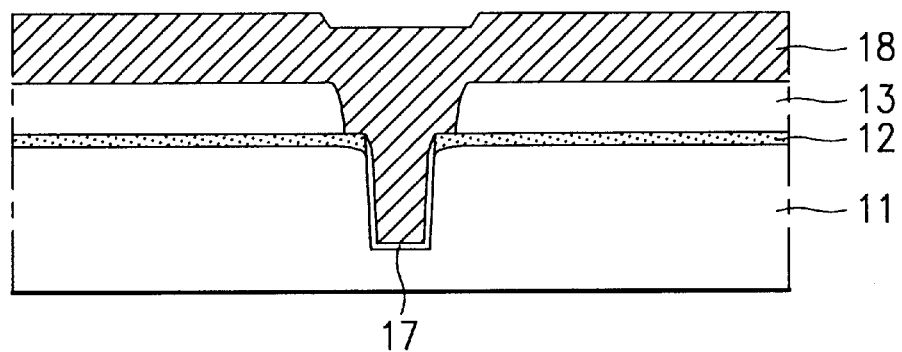

As shown in FIG. 2F, a fourth insulating layer 18 is formed on an entire surface of second insulating layer 13, including the third insulating layer 17. When forming the fourth insulating layer 18, the rounded tops at both sides of the trench 16 facilitate filling of gaps in the trench 16 without any voids. The fourth insulating layer 18 may be formed by using several oxide and nitride layers. If the fourth insulating layer 18 is formed from a single oxide layer, a high temperature low pressure dielectric (HLD) oxide layer is used.

Figure 2G:
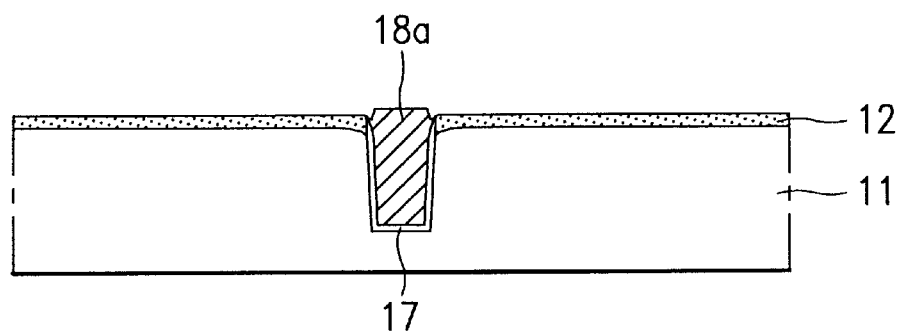

As shown in FIG. 2G, the fourth and second insulating layers 18 and 13 are subjected to a chemical mechanical polishing (CMP), to form an isolation layer 18a at an upper portion of the trench 16.

The fourth insulating layer 18 is polished to remain at the upper portion of the trench 16. That is, when a top of the second insulating layer 13 is exposed, the polishing process is stopped, removing the second insulating layer 13. At this time, the second insulating layer 13 is polished until a thickness of the second insulating layer 13 becomes half of its previous value. Then, the polishing process is stopped, and the second insulating layer 13 is level with the substrate 11.

Figure 2H:
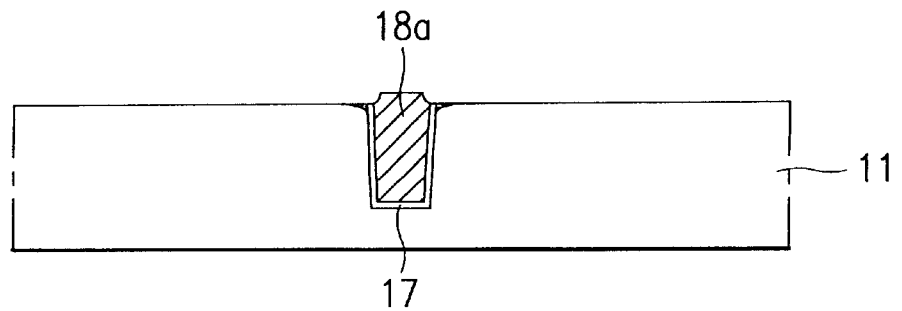

As shown in FIG. 2H, the first insulating layer 12 is removed. The isolation layer 18a is also partly removed to be slightly higher than or level with the trench 16.

A gate oxide layer and a gate electrode (not shown) are formed on the substrate 11 after the PGI formation process described above.

The present invention results in the following advantages:

First, the rounded shape of the upper corner of the trench 16 can relieve stress on the upper corner, such as stress due to a leakage current or due to an electric field concentration. A semiconductor device is thus formed to have an isolation region with a highly reliable PGI structure.

Second, the rounded upper corner of the trench 16 prevents the formation of voids during deposition of an insulating layer for isolation layer formation. This allows manufacturing of more highly integrated semiconductor devices.

It will be apparent to those skilled in the art that various modifications and variations can be made in the method for forming the isolation region of the semiconductor device of the present invention without deviating from the spirit or scope of the invention. Thus, it is intended that the present invention cover the modifications and variations of this invention provided they come within the scope of the appended claims and their equivalents.

What is claimed is:

1. A method for forming an isolation region of a semiconductor device, the method comprising the steps of:
   forming first and second insulating layers on a substrate;
   removing the second insulating layer over an isolation region;
   forming a field oxide layer from the first insulating layer over the isolation region;
   forming sidewall spacers at sides of the second insulating layer and over the isolation region after forming the field oxide region;
   then forming a trench by etching the field oxide layer and the substrate at the isolation region;
   removing the sidewall spacers;
   forming a third insulating layer on the substrate in the trench; and
   forming an isolation layer in the trench.

2. The method as claimed in claim 1, wherein the first and second insulating layers have different etching selectivity ratios.

3. The method as claimed in claim 1, wherein the first insulating layer includes an oxide, the second insulating layer includes a nitride, and the isolation layer includes at least one of an oxide and a nitride.

4. The method as claimed in claim 1, wherein the second insulating layer is at least ten times as thick as the first insulating layer, and
   wherein the field oxide layer is between two and three times as thick as the first insulating layer.

5. The method as claimed in claim 1, wherein the second insulating layer has a thickness of at least 1500 Å, and
   wherein the oxide layer has a thickness between about 200 and 300 Å.

6. The method as claimed in claim 1, wherein the field oxide layer has a thickness of up to ⅓ of a thickness of the second insulating layer.

7. The method as claimed in claim 1, wherein a bottom edge corner of the second insulating layer over an edge of the isolation region is not damaged when the field oxide layer is formed.

8. The method as claimed in claim 1, wherein an upper corner of the substrate adjacent to an edge of the isolation region is rounded when the first insulating layer is oxidized to form the field oxide layer.

9. The method as claimed in claim 1, wherein the sidewall spacers include at least one of an oxide and a nitride.

10. The method as claimed in claim 1, wherein an insulating layer for sidewall spacers formation is formed on the entire surface of the second insulating layer, including the field oxide layer, and then etched back, to form the sidewall spacers.

11. The method as claimed in claim 10, wherein, when the sidewall spacers are removed, a top surface of the second insulating layer is partially removed to a predetermined thickness to round a top edge corner of the second insulating layer over the isolation region.

12. The method as claimed in claim 1, whrein the step of removing the sidewall spacers occurs after the trench is formed.

13. The method as claimed in claim 1, wherein the trench is formed by using the sidewall spacers and the second insulating layer as masks.

14. The method as claimed in claim 1, wherein the isolation layer is formed from a high temperature low pressure dielectric (HLD) oxide.

15. The method as claimed in claim 1, wherein the second insulating layer is thicker than the first insulating layer, and the field oxide layer is thinner than the second insulating layer.

16. The method as claimed in claim 1, wherein the first and second insulating layers are removed after the step of forming the isolation layer.

17. The method as claimed in claim 1, wherein the third insulating layer is formed by thermally treating the substrate.

18. The method as claimed in claim 1, wherein an insulating film is formed on the third insulating layer and in the trench, and then etched to form the isolation layer.

19. A method of forming an isolation region of a semiconductor device comprising the steps of:
   forming a first insulating film on a substrate;
   forming a second insulating film on the first insulating film;
   selectively removing the second insulating film over an isolation region;
   oxidizing the first insulating film over the isolation region to form a field oxide film;
   and then forming sidewall spacers at sides of the second insulating film;
   selectively removing the second insulating film and a portion of the substrate to form a trench in the substrate;
   removing the sidewall spacers;
   forming a third insulating film in the trench; and
   forming an isolation layer in the trench.

20. The method as claimed in claim 19, wherein the first and second insulating films have different etching selectivity ratios.

21. The method as claimed in claim 19, wherein the first insulating film includes an oxide, the second insulating film includes a nitride, and the isolation layer includes at least one of an oxide and a nitride.

22. The method as claimed in claim 19, wherein the second insulating film is at least ten times as thick as the first insulating film, and
wherein the field oxide film is between two and three times as thick as the first insulating film.

23. The method as claimed in claim 19, wherein the second insulating film has a thickness of at least 1500 Å, and
wherein the field oxide film has a thickness between about 200 and 300 Å.

24. The method as claimed in claim 19, wherein the field oxide film has a thickness of up to ⅕ of a thickness of the second insulating film.

25. The method as claimed in claim 19, wherein a bottom edge corner of the second insulating film over an edge of the isolation region is not damaged when the first insulating film is oxidized to form the field oxide film.

26. The method as claimed in claim 19, wherein an upper corner of the substrate adjacent to an edge of the isolation region is rounded when the first insulating film is oxidized to form the field oxide film.

27. The method as claimed in claim 19, wherein the sidewall spacers include at least one of an oxide and a nitride.

28. The method as claimed in claim 19, wherein an insulating film for sidewall spacers formation is formed on the entire surface of the second insulating film, including the field oxide film, and then etched back, to form the sidewall spacers.

29. The method as claimed in claim 28, wherein, when the sidewall spacers are removed, a top surface of the second insulating film is partially removed to a predetermined thickness to round a top edge corner of the second insulating film over the isolation region.

30. The method as claimed in claim 19, wherein the step of removing the sidewall spacers occurs after the trench is formed.

31. The method as claimed in claim 19, wherein the trench is formed by using the sidewall spacers and the second insulating film as masks.

32. The method as claimed in claim 19, wherein the isolation layer is formed from a high temperature low pressure dielectric (HLD) oxide.

33. The method as claimed in claim 19, wherein the second insulating film is thicker than the first insulating film, and the field oxide film is thinner than the second insulating film.

34. The method as claimed in claim 19, wherein the first and second insulating films are removed after the step of forming the isolation layer.

35. The method as claimed in claim 19, wherein the third insulating film is formed by thermally treating the substrate.

36. The method as claimed in claim 19, wherein an insulating film is formed on the third insulating film and in the trench, and then etched to form the isolation layer.

* * * * *

UNITED STATES PATENT AND TRADEMARK OFFICE
CERTIFICATE OF CORRECTION

PATENT NO. : 6,124,184
DATED : September 26, 2000
INVENTOR(S) : Jeong

Page 1 of 1

It is certified that error appears in the above-identified patent and that said Letters Patent is hereby corrected as shown below:

Claim 12, line 1, change "whrein" to --wherein--.

Signed and Sealed this

Fifth Day of June, 2001

*Attest:*

*Attesting Officer*

NICHOLAS P. GODICI
*Acting Director of the United States Patent and Trademark Office*